(12) United States Patent
Hu et al.

(10) Patent No.: US 10,580,739 B2
(45) Date of Patent: Mar. 3, 2020

(54) PACKAGE SUBSTRATE AND ASSOCIATED FABRICATION METHOD WITH VARYING DEPTHS FOR CIRCUIT DEVICE TERMINALS

(71) Applicant: PHOENIX & CORPORATION, Grand Cayman (KY)

(72) Inventors: Chu-Chin Hu, Hsinchu County (TW); Shih-Ping Hsu, Hsinchu County (TW)

(73) Assignee: PHOENIX & CORPORATION, Grand Cayman (KY)

( * ) Notice: Subject to any disclaimer, the term of this patent is extended or adjusted under 35 U.S.C. 154(b) by 0 days.

(21) Appl. No.: 15/786,771

(22) Filed: Oct. 18, 2017

(65) Prior Publication Data

US 2018/0130745 A1    May 10, 2018

(30) Foreign Application Priority Data

Nov. 4, 2016   (TW) .............................. 105136010 A

(51) Int. Cl.
*H01L 23/31*        (2006.01)
*H01L 23/48*        (2006.01)
(Continued)

(52) U.S. Cl.
CPC .... *H01L 23/5384* (2013.01); *H01L 21/76802* (2013.01); *H01L 21/76877* (2013.01); *H01L 23/3114* (2013.01); *H01L 23/3121* (2013.01); *H01L 23/3157* (2013.01); *H01L 23/481* (2013.01); *H01L 23/5383* (2013.01); *H01L 23/5386* (2013.01); *H01L 24/03* (2013.01); *H01L 24/06* (2013.01); *H01L 21/568* (2013.01); *H01L 2224/0231* (2013.01); *H01L 2224/02331* (2013.01); *H01L 2924/14* (2013.01)

(58) Field of Classification Search
CPC ............. H01L 23/5384; H01L 23/3157; H01L 23/3114; H01L 23/481; H01L 25/042; H01L 25/0655; H01L 23/3121
See application file for complete search history.

(56) References Cited

U.S. PATENT DOCUMENTS 9,691,635 B1 * 6/2017 Huemoeller ........ H01L 21/4857
2005/0006783 A1 * 1/2005 Takao ................. H01L 23/3114
257/774
(Continued)

*Primary Examiner* — Allen L Parker
*Assistant Examiner* — Gustavo G Ramallo
(74) *Attorney, Agent, or Firm* — WPAT, PC

(57) ABSTRACT

This disclosure provides a package substrate and its fabrication method. The package substrate includes: a molding compound body; a first circuit device disposed in the molding compound body, the first circuit device having a first terminal at a top of the first circuit device; a first conductive via formed in the molding compound body and connected to the first terminal; a second circuit device disposed in the molding compound body, the second circuit device having a second terminal at a top of the second circuit device; a second conductive via formed in the molding compound body and connected to the second terminal; and a redistribution layer with a conductive wire formed on the molding compound body, the conductive wire connecting the first conductive via and the second conductive via; wherein the first and second terminals are respectively located at different depths of the molding compound body.

14 Claims, 4 Drawing Sheets

(51) Int. Cl.
*H01L 23/538* (2006.01)
*H01L 21/768* (2006.01)
*H01L 23/00* (2006.01)
*H01L 21/56* (2006.01)

(56) References Cited

U.S. PATENT DOCUMENTS

| | | | |
|---|---|---|---|
| 2006/0131720 A1* | 6/2006 | Li | H01L 23/3142 257/687 |
| 2009/0079065 A1* | 3/2009 | Furgut | H01L 23/3121 257/724 |
| 2012/0146209 A1* | 6/2012 | Hu | H01L 23/36 257/692 |
| 2012/0264296 A1* | 10/2012 | Chern | H01L 21/02057 438/667 |
| 2013/0082383 A1* | 4/2013 | Aoya | H01L 23/3128 257/738 |
| 2015/0243573 A1* | 8/2015 | Hu | H01L 21/304 257/793 |
| 2017/0053897 A1* | 2/2017 | Lai | H01L 25/0657 |
| 2017/0317000 A1* | 11/2017 | Nishimura | H01L 25/0655 |
| 2017/0373041 A1* | 12/2017 | Kim | H01L 25/0657 |

* cited by examiner

PACKAGE SUBSTRATE AND ASSOCIATED FABRICATION METHOD WITH VARYING DEPTHS FOR CIRCUIT DEVICE TERMINALS

CROSS REFERENCE TO RELATED APPLICATION

This application claims the benefit of Taiwan application Serial No. 105136010, filed on Nov. 4, 2016, the disclosure of which is incorporated by reference herein in its entirety.

FIELD OF THE INVENTION

The present invention relates to a package substrate and its fabrication method.

BACKGROUND OF THE INVENTION

As recent rapid trend in modern electronic devices is not only toward lighter and smaller devices, but also toward multi-function and high-performance devices, the integrated-circuit (IC) fabrication and technology has to evolve correspondingly toward a more high-density and miniature design so as to allow more electronic components to be received inside limited chip space. Consequently, the relating IC package structure and the package technology are evolved accordingly to meet the trend.

Conventionally, a wafer-level packaging process can be illustrated in FIG. 1A-1C. At first, an adhesive layer 18 is formed on a wafer carrier 11 as shown in FIG. 1A. Next, a semiconductor die 13 and an electronic component 15 with their connection terminals 16 at the bottoms are bonded onto the carrier 11 through the adhesive layer 18, and then a molding compound 12 is formed on the carrier 11 to cover the semiconductor die 13 and the electronic component 15 to be a package unit as shown in FIG. 1B. After the carrier 11 and the adhesive layer 18 is removed, the semi-finished package structure 20 is turned over and a redistribution layer (RDL) 17 is then formed on the upper surface 21 of the semi-finished package structure 20 as shown in FIG. 1C.

It is difficult to fabricate a fine-pitch-wiring RDL 17 by a conventional photolithography means, because fine-pitch wires can be realized only if the upper surface 21 of the semi-finished package structure 20 is very flat. However, to achieve the high surface flatness, a costly adhesive is needed as the adhesive layer 18 and the semiconductor die 13 and the electronic component 15 have to be bonded onto the adhesive layer 18 in a slow and precise way, which would increase the fabrication cost. Moreover, the electronic component 15 has to be provided with electrode pads like under bump metallization (UBM) or solder bumps, so that the electronic component 15 can be electrically connected to the RDL 17. However, the electrode pads are costly in the IC fabrication process, and the thermal expansion discrepancy among the electronic component 15, the molding compound 12 and the RDL 170 may cause the failure or cracks in the bonding of the electronic component 15 and the RDL 17. Therefore, it is in need of a new and advanced packaging solution to reduce the fabrication cost.

SUMMARY OF THE INVENTION

According to one aspect of the present disclosure, one embodiment provides a package substrate including: a molding compound body; a first circuit device disposed in the molding compound body, the first circuit device having a first terminal at a top of the first circuit device and a first barrier layer on the first terminal; a first conductive via formed in the molding compound body and connected to the first terminal; a second circuit device disposed in the molding compound body, the second circuit device having a second terminal at a top of the second circuit device and a second barrier layer on the second terminal; a second conductive via formed in the molding compound body and connected to the second terminal; and a redistribution layer with a conductive wire formed on the molding compound body, the conductive wire connecting the first conductive via and the second conductive via; wherein the first and second terminals are respectively located at a first depth and a second depth of the molding compound body, and the first depth is different from the second depth.

In one embodiment, the first circuit device comprises a semiconductor chip or an electronic component, and the second circuit device comprises a semiconductor chip or an electronic component.

In one embodiment, each of the first and second barrier layers comprises a copper layer, a silver layer, a zinc/nickel/copper multilayer, or a zinc/nickel/silver multilayer.

In one embodiment, the first circuit device and the second circuit device are adhered to a metal plate by using a thermally conductive adhesion layer, wherein the thermally conductive adhesion layer buried in the molding compound body and flushed with the molding compound body.

In one embodiment, a protective layer is formed below the molding compound body.

In one embodiment, an adhesion primer layer is formed on the molding compound body.

According to one aspect of the present disclosure, one embodiment provides a method for fabricating a package substrate which comprises: a molding compound body; a first circuit device with a first surface and an opposite second surface disposed in the molding compound body, the first circuit device having a first terminal at the first surface and a first barrier layer on the first terminal; a first conductive via formed in the molding compound body and connected to the first terminal; a second circuit device with a third surface and an opposite fourth surface disposed in the molding compound body, the second circuit device having a second terminal at the third surface and a second barrier layer on the second terminal; a second conductive via formed in the molding compound body and connected to the second terminal; and a redistribution layer with a conductive wire formed on the molding compound body, the conductive wire connecting the first conductive via and the second conductive via; the method comprising steps of: (A) providing a carrier; (B) adhering the first and second circuit devices onto the carrier, while enabling both the second surface of the first circuit device and the fourth surface of the second circuit device to touch the carrier; wherein, the first and second terminals are respectively located at a first height and a second height above the carrier, and the first height is different from the second height; (C) forming a molding compound body while enabling the molding compound body to cover the first and second circuit devices; (D) forming first and second openings in the molding compound body while enabling the first opening to be on the first terminal of the first circuit device and the second opening to be on the second terminal of the second circuit device; (E) filling the first and second openings with a conductive material to be the first and second conductive vias, respectively; and (F) forming a redistribution layer on the first and second conductive vias.

In one embodiment, the first and second openings are formed by laser drilling in step (D).

In one embodiment, the first and second openings are formed by different laser energies.

In one embodiment, the method further comprises: forming an adhesion primer layer on the molding compound body after step (C).

In one embodiment, the first and second circuit devices are adhered onto the carrier by using a thermally conductive adhesion layer in step (B), wherein the thermally conductive adhesion layer buried in the molding compound body and flushed with the molding compound body.

In one embodiment, the first and second circuit devices are adhered onto the carrier by using an insulating adhesion layer in step (B), and the method further comprises: removing the carrier.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

In the following embodiments of the present disclosure, when an element is described to be disposed above/mounted on top of or below/under another element, it comprises either the element is directly or indirectly disposed above/below the other element, i.e. when indirectly, there can be some other element arranged between the two; and when directly, there is no other element disposed between the two. It is noted that the descriptions in the present disclosure relate to "above" or "below" are based upon the related diagrams provided, but are not limited thereby. Moreover, the terms "first", "second", and "third", and so on, are simply used for clearly identifying different elements of the same nature, but those elements are not restricted thereby and must be positioned or arranged accordingly. In addition, the size or thickness of each and every element provided in the following diagrams of the present disclosure is only schematic representation used for illustration and may not represent its actual size.

Figure 1A:
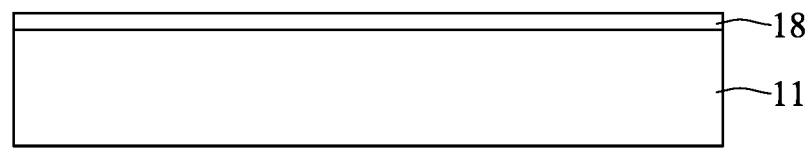
FIG. 1A-1C shows a conventional wafer-level packaging process.
Figure 1B:
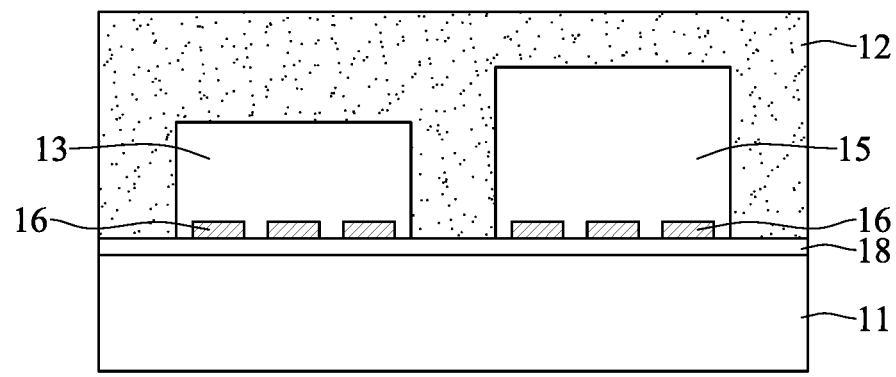
Figure 1C:
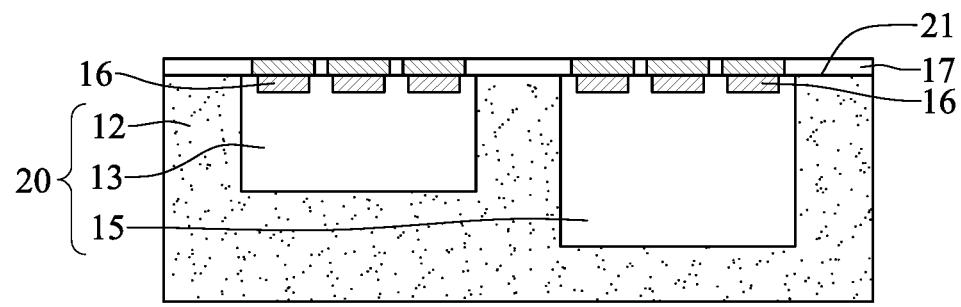
Figure 2:
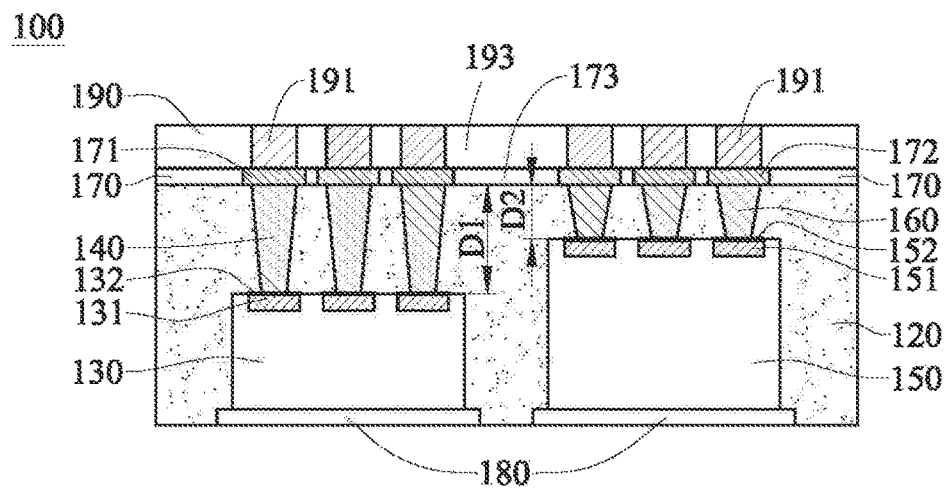
FIG. 2 is a cross-sectional view of the package substrate according to a first embodiment of the present invention.

FIG. 2 shows a cross-sectional view of the package substrate 100 according to a first embodiment of the present invention. The package substrate 100 includes: a molding compound body 120, a first circuit device 130, a first conductive via 140, a second circuit device 150, a second conductive via 160 and a redistribution layer (RDL) 170; wherein, the molding compound body 120 acts as the main body of the package substrate 100, which covers and surrounds the first circuit device 130 and the second circuit device 150 and also supports the RDL 170. The first circuit device 130 is provided with plural first terminals 131 at its top, while the second circuit device 150 is provided with plural second terminals 151 at its top. When the first circuit device 130 and the second circuit device 150 are disposed in the molding compound body 120 during the fabrication of the package substrate 100, the connecting pins or pads, the terminals 131 and 151, of both the first circuit device 130 and the second circuit device 150 face upwards.

The first circuit device 130 and the second circuit device 150 are bonded to the bottom of the molding compound body 120 by using an adhesion layer 180, so that the adhesion layer 180 is buried in the molding compound body 120 and flushed with the molding compound body 120; wherein, the first circuit device 130 is not vertically overlapped with the second circuit device 150. In the embodiments, each of the first circuit device 130 and the second circuit device 150 may be an IC chip, a semiconductor die, or an electronic component like multi-layer ceramic capacitor (MLCC). As shown in FIG. 2, the first circuit device 130 and the second circuit device 150 have different thicknesses; hence the first terminals 131 and the second terminals 151 are respectively located at different depths D1 and D2 down from the top of the molding compound body 120. The first conductive via 140 and the second conductive via 160 are formed in the molding compound body 120 to respectively connect the first circuit device 130 and the second circuit device 150 to the RDL 170. The conductive vias 140 and 160 can be formed by first laser drilling (or laser ablating) or plasma etching through openings on the terminals 131 and 151, and then filling the through openings with conductive material. Though the first terminals 131 and the second terminals 151 are not in the same horizontal, the first conductive via 140 and the second conductive via 160 can compensate the depth discrepancy between the terminals 131 and 151 of the first circuit device 130 and the second circuit device 150; thus, fine-pitch conductive wires of the RDL 170 can be laid out on a flat top surface of the molding compound body 120 and processed by using a conventional photolithography means.

Before the formation of the conductive vias 140 and 160, a barrier layer may be formed on the circuit devices 130 and 150 by chemical plating or electroless plating. The barrier layer may be made of a copper layer, a silver layer, a zinc/nickel/copper multilayer, or a zinc/nickel/silver multilayer with a thickness of 0.5-10 μm. Thus, a first barrier layer 132 is formed on the first terminal 131 of the first circuit device 130 to improve the electrical connectivity between the first conductive via 140 and the first terminal 131, and a second barrier layer 152 is formed on the second terminal 151 of the second circuit device 150 to improve the electrical connectivity between the second conductive via 160 and the second terminal 151. The barrier layers 132 and 152 can protect the terminals 131 and 151 from be damaged in the laser drilling process of the conductive vias 140 and 160. Also, the barrier layers 132 and 152 have the advantage of reduce the fabrication cost, compared with the UMB and solder bumping.

The RDL 170 is an extra metal layer laid out on the molding compound body 120, that makes the access pads (the terminals 131 and 151) of the circuit devices 130 and 150 available in other locations. In other words, when the circuit devices 130 and 150 are disposed in the molding compound body 120, the locations of the terminals 131 and 151 are firmly fixed after the molding compound body 120 is hardened; so, the RDL 170 can electrically redistribute the locations of the terminals 131 and 151 to appropriate locations. The RDL 170 may include plural conductive wires 171 and 172 formed on the conductive vias 140 and 160, respectively. As shown in FIG. 2, the first conductive via 140 is used to connect the first terminal 131 to the conductive wire 171, while the second conductive via 160 is used to connect the second terminal 151 to the conductive wire 172.

To connect the conductive wires 171 and 172 upwards to an external circuit, a pillar layer 190 is formed on the RDL 170. The pillar layer 190 may include plural metal pillars 191 corresponding to the conductive wires 171 and 172. As shown in FIG. 2, the conductive wires 171 and 172 occupy a part space of the RDL 170 while the metal pillars 191 occupy a part space of the pillar layer 190. The remainder spaces 173 and 193 can be filled with suitable dielectric material, so that the package substrate 100 becomes a complete package device. In the embodiment, the adhesion layer 180 may be made of insulating material bonded to the bottom of the molding compound body 120, so as to protect the package substrate 100 from being damaged by external objects.

Figure 3:
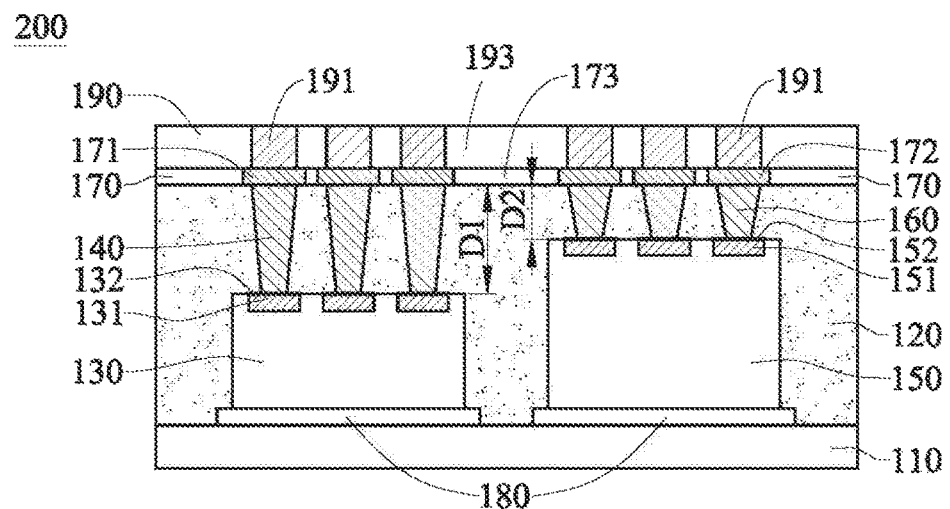
FIG. 3 is a cross-sectional view of a package substrate according to a second embodiment of the present invention.

FIG. 3 is a cross-sectional view of a package substrate 200 according to a second embodiment of the present invention. The package substrate 200 is in many ways identical to the package substrate 100 of the first embodiment in FIG. 2, but the adhesion layer 180 is made of thermally conductive material at the bottom of the molding compound body 120, and the circuit devices 130 and 150 are bonded to a metal plate 110 by using the adhesion layer 180, to be buried in the molding compound body 120 and flushed with the molding compound body 120. The metal plate 110 can be the carrier substrate used to support and carry the unfinished package substrate 200 during its fabrication process, and it can be reserved and not removed here to act as a heat sink for the circuit devices 130 and 150.

Figure 4:
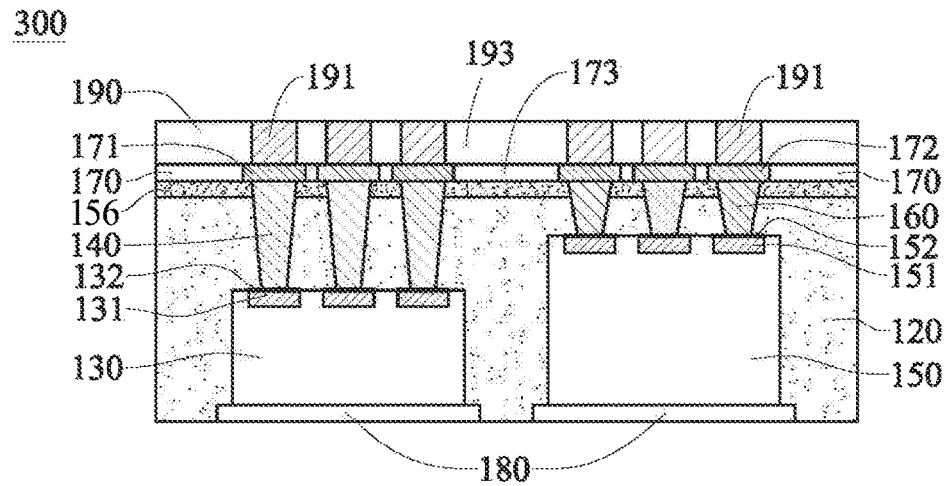
FIG. 4 is a cross-sectional view of a package substrate according to a third embodiment of the present invention.

FIG. 4 is a cross-sectional view of a package substrate 300 according to a third embodiment of the present invention. The package substrate 300 is in many ways identical to the package substrate 100 of the first embodiment in FIG. 2, but it further comprises an adhesion primer layer 156 on the molding compound body 120. The adhesion primer layer 156 is made of organic polymer material with a functional group subject to be chemically bonded to metal and molding compound. Due to the adhesion primer layer 156, a fine-pitch wiring circuitry can be better formed on the molding compound body 120. To form the conductive wires 171 and 172 of fine patch on the molding compound body 120, the adhesion primer layer 156 would facilitate the metal layer deposited thereon to get thin metal threads or wires of good quality.

The fabrication process will be described in detail in the following paragraphs. Wherein, FIGS. 5-8 and 3 are cross-sectional views of the package substrate 200 of the second embodiment in the present disclosure, corresponding to different process steps.

At first, a carrier substrate 110 is provided to carry and support electronic components and conductive wires of the package substrate 100 in the fabrication process. The carrier substrate 110 can be a metal plate or a dielectric plate coated with a metal layer, in which the metal can be Fe, Cu, Ni, Sn, Al, Ni/Au or their combination.

Figure 5:
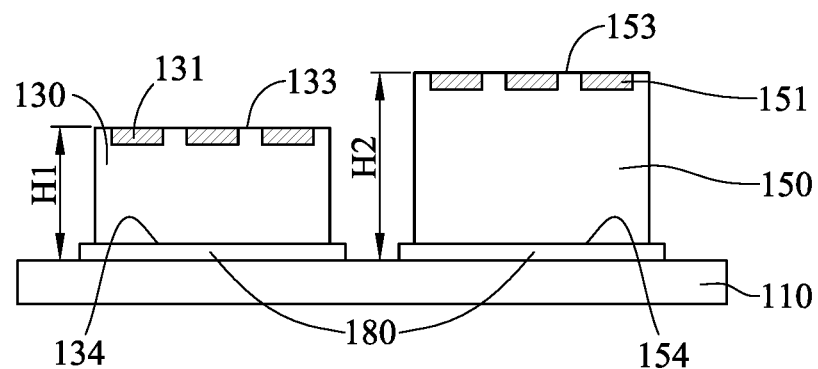
FIG. 5-8 are cross-sectional views of the package substrate of the second embodiment in the present disclosure, corresponding to different process steps.

Next, a first circuit device 130 and a second circuit device 150 are adhered to the carrier substrate 110 as shown in FIG. 5. The first circuit device 130 has a first surface 133 and an opposite second surface 134, and its connecting pads or terminals 131 are arranged at the first surface 133. The second circuit device 150 has a third surface 153 and an opposite fourth surface 154, and its connecting pads or terminals 151 are arranged at the third surface 153. Here, the circuit devices 130 and 150 are adhered to the carrier substrate 110 by using an adhesion layer 180, while enabling both the second surface 134 of the first circuit device 130 and the fourth surface 154 of the second circuit device 150 to touch the top surface of the carrier substrate 110. Wherein, the adhesion layer 180 is buried in the molding compound body 120 and flushed with the molding compound body 120, and the first circuit device 130 is not vertically overlapped with the second circuit device 150. If the first circuit device 130 and the second circuit device 150 are semiconductor dies or electronic components with different thicknesses, the terminals 131 and 151 are respectively located at different heights H1 and H2 above the top of the carrier substrate 110.

Figure 6:
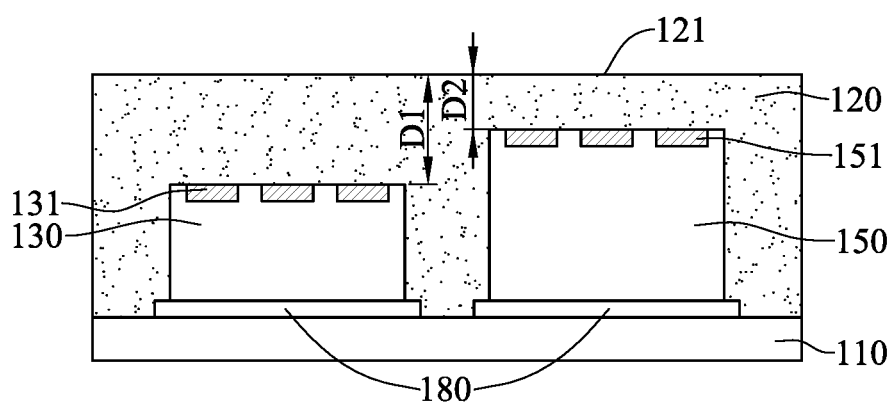

Next, a molding compound body 120 is formed on the carrier substrate 110 to cover the circuit devices 130 and 150 as shown in FIG. 6. The molding compound body 120 can be formed of an insulation material selected from the group consisting of novolac-based resin, epoxy-based resin and silicon-based resin by a molding means like compression molding or thin-film vacuum molding. After the molding compound body 120 is cured or hardened, the circuit devices 130 and 150 and the molding compound body 120 can be combined to be a firm package unit. The molding compound body 120 is then polished or ground to remove the upper part of the molding compound body 120 in a top-down manner, so as to get a flat top surface 121 for the fabrication of a fine-pitch RDL 170. The terminals 131 and 151 are respectively located at different depths D1 and D2 down from the top surface 121 of the molding compound body 120.

Figure 7:
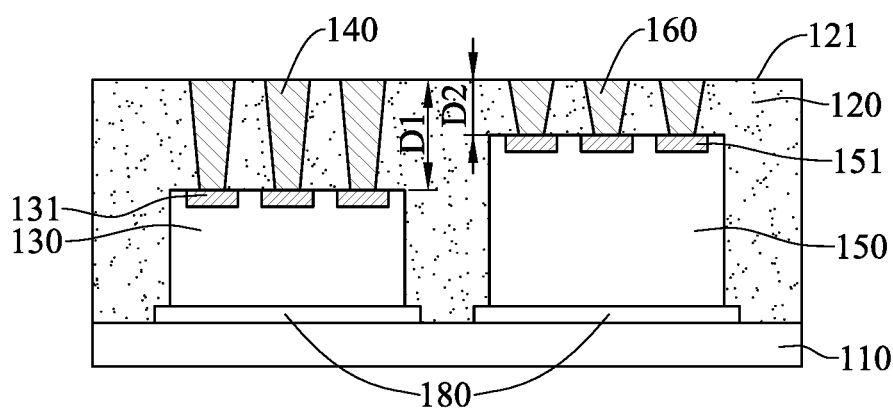

Next, the first conductive via 140 and the second conductive via 160 are formed in the molding compound body 120 as shown in FIG. 7. It can be performed by first laser drilling (or laser ablating) or plasma etching through openings on the terminals 131 and 151, and then filling the through openings with conductive material. Because the terminals 131 and 151 are respectively located at different depths D1 and D2 down from the top surface 121 of the molding compound body 120, the through openings can be formed by different laser energies. If a pulsed laser is used to drill the above-recited through openings, the opening depths would depend on wavelength and pulse width of the laser as well as optical property of the molding compound body 120. Here, the laser energy for drilling the first through opening 140 is larger than that for the second through opening 160. The through openings 140 and 160 are then filled with conductive material like copper, aluminum and gold, to be the conductive vias 140 and 160.

Figure 8:
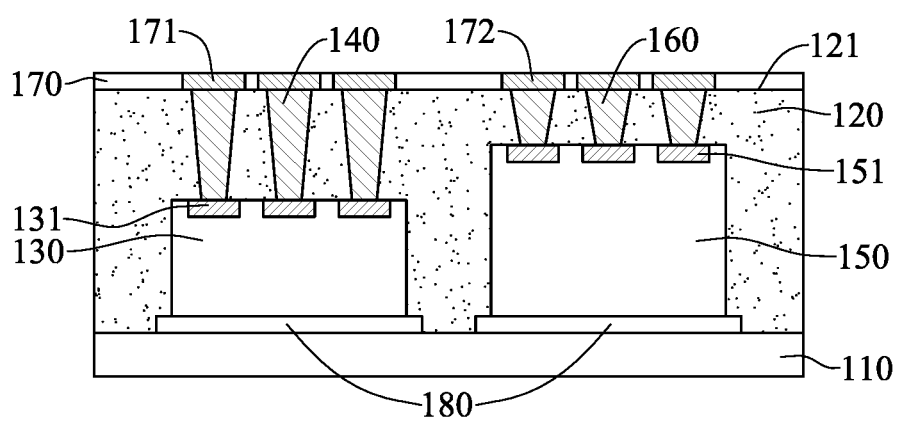

Next, a RDL 170 is formed on the conductive vias 140 and 160 as shown in FIG. 8. The RDL 170 is an extra metal layer laid out on the molding compound body 120, that makes the access pads (the terminals 131 and 151) of the circuit devices 130 and 150 available in other locations. Though the terminals 131 and 151 are not in the same horizontal, the conductive vias 140 and 160 can compensate the depth discrepancy between the terminals 131 and 151; thus, fine-pitch conductive wires of the RDL 170 can be laid out on a flat top surface of the molding compound body 120 and processed by using a conventional photolithography means. The first conductive via 140 is used to connect the first terminal 131 to the conductive wire 171, while the second conductive via 160 is used to connect the second terminal 151 to the conductive wire 172.

Next, a pillar layer 190 including plural metal pillars 191 is formed on the RDL 170. As shown in FIG. 3, the conductive wires 171 and 172 occupy a part space of the RDL 170 while the metal pillars 191 occupy a part space of the pillar layer 190. The remainder spaces 173 and 193 can be filled with suitable dielectric material, so that the package substrate 100 becomes a complete package device. Here, the carrier substrate 110 is a metal plate and the adhesion layer 180 is made of thermally conductive material, so that their combination can act as a heat sink for the circuit devices 130 and 150.

In another embodiment, the adhesion layer 180 may be made of insulating material, and the carrier substrate 110 can be removed as shown in FIG. 2. Here, the adhesion layer 180 may act as a protective layer bonded to the bottom of the molding compound body 120, so as to protect the package substrate 100 from being damaged by external objects.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. A package substrate comprising:
    a molding compound body;
    a first circuit device disposed in the molding compound body, the first circuit device having a first terminal at a top of the first circuit device and a first barrier layer on the first terminal;
    a first conductive via formed in the molding compound body and connected to the first terminal;
    a second circuit device disposed in the molding compound body, the second circuit device having a second terminal at a top of the second circuit device and a second barrier layer on the second terminal;
    a second conductive via formed in the molding compound body and connected to the second terminal; and
    a redistribution layer with a conductive wire formed on the molding compound body, the conductive wire connecting the first conductive via and the second conductive via;
    wherein the first circuit device and the second circuit device do not overlap and are bonded to the bottom of the molding compound body in the same plane;
    wherein a thermally conductive adhesion layer is disposed under bottom of the first circuit device and the second circuit device; the thermally conductive adhesion layer buried in the molding compound body and flushed with the molding compound body; a bottom surface of the thermally conductive adhesion layer and the a bottom surface of the molding compound body are flush; and
    wherein the first and second terminals are respectively located at a first depth and a second depth of the molding compound body, and the first depth is different from the second depth.

2. The package substrate of claim 1, wherein the first circuit device comprises a semiconductor chip or an electronic component, and the second circuit device comprises a semiconductor chip or an electronic component.

3. The package substrate of claim 1, wherein each of the first and second barrier layers comprises a copper layer, a silver layer, a zinc/nickel/copper multilayer, or a zinc/nickel/silver multilayer.

4. The package substrate of claim 1, wherein a protective layer is formed below the molding compound body.

5. The package substrate of claim 1, wherein an adhesion primer layer is formed on the molding compound body.

6. A method for fabricating a package substrate, which comprises:
    a molding compound body;
    a first circuit device with a first surface and an opposite second surface disposed in the molding compound body, the first circuit device having a first terminal at the first surface and a first barrier layer on the first terminal;
    a first conductive via formed in the molding compound body and connected to the first terminal;
    a second circuit device with a third surface and an opposite fourth surface disposed in the molding compound body, the second circuit device having a second terminal at the third surface and a second barrier layer on the second terminal;
    a second conductive via formed in the molding compound body and connected to the second terminal; and
    a redistribution layer with a conductive wire formed on the molding compound body, the conductive wire connecting the first conductive via and the second conductive via; the method comprising steps of:
    (A) providing a metal carrier;
    (B) adhering the first and second circuit devices onto the metal carrier in the same plane such that the first and second circuit devices do not overlap, while enabling both the second surface of the first circuit device and the fourth surface of the second circuit device to touch the carrier, wherein the first circuit device and the second circuit device are adhered to the metal carrier by using a thermally conductive adhesion layer, the thermally conductive adhesion layer buried in the molding compound body and flushed with the molding compound body, and the first and second terminals are respectively located at a first height and a second height above the carrier, and the first height is different from the second height;
    (C) forming a molding compound body while enabling the molding compound body to cover the first and second circuit devices;
    (D) forming first and second openings in the molding compound body while enabling the first opening to be on the first terminal of the first circuit device and the second opening to be on the second terminal of the second circuit device;
    (E) filling the first and second openings with a conductive material to be the first and second conductive vias, respectively; and
    (F) forming a redistribution layer on the first and second conductive vias.

7. The method of claim 6, wherein the first and second openings are formed by laser drilling in step (D).

8. The method of claim 7, wherein the first and second openings are formed by different laser energies.

9. The method of claim 6, further comprising:
forming an adhesion primer layer on the molding compound body after step (C).

10. The method of claim 6, further comprises:
removing the metal carrier to expose the molding compound body and the thermally conductive adhesion layer.

11. The package substrate of claim 6, wherein the thermally conductive adhesion layer is an insulating adhesion layer.

12. A method for fabricating a package substrate, the package substrate comprising:
a molding compound body;
a first circuit device with a first surface and an opposite second surface disposed in the molding compound body, the first circuit device having a first terminal at the first surface and a first barrier layer on the first terminal;
a first conductive via formed in the molding compound body and connected to the first terminal;
a second circuit device with a third surface and an opposite fourth surface disposed in the molding compound body, the second circuit device having a second terminal at the third surface and a second barrier layer on the second terminal;
a second conductive via formed in the molding compound body and connected to the second terminal; and
a redistribution layer with a conductive wire formed on the molding compound body, the conductive wire connecting the first conductive via and the second conductive via;

wherein the method comprises the steps of:
(A) providing a carrier;
(B) adhering the first and second circuit devices onto the carrier, while enabling both the second surface of the first circuit device and the fourth surface of the second circuit device to touch the carrier; wherein, the first and second terminals are respectively located at a first height and a second height above the carrier, and the first height is different from the second height;
(C) forming a molding compound body while enabling the molding compound body to cover the first and second circuit devices;
(D) forming first and second openings in the molding compound body while enabling the first opening to be on the first terminal of the first circuit device and the second opening to be on the second terminal of the second circuit device;
(E) filling the first and second openings with a conductive material to be the first and second conductive vias, respectively; and
(F) forming a redistribution layer on the first and second conductive vias;
wherein the first and second circuit devices are adhered onto the carrier by using a thermally conductive adhesion layer in step (B), wherein the thermally conductive adhesion layer is buried in the molding compound body and flushed with the molding compound body.

13. The method of claim 12, further comprises:
removing the carrier to expose the molding compound body and the thermally conductive adhesion layer.

14. The method of claim 12, wherein the thermally conductive adhesion layer is an insulating adhesion layer.

* * * * *